(12) United States Patent
Seo

(10) Patent No.: US 7,515,492 B2
(45) Date of Patent: Apr. 7, 2009

(54) SEMICONDUCTOR MEMORY DEVICE

(75) Inventor: Ju-Young Seo, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 42 days.

(21) Appl. No.: 11/823,965

(22) Filed: Jun. 29, 2007

(65) Prior Publication Data

US 2008/0080281 A1 Apr. 3, 2008

(30) Foreign Application Priority Data

Sep. 28, 2006 (KR) .................. 10-2006-0095187

(51) Int. Cl.
*G11C 7/00* (2006.01)

(52) U.S. Cl. .................. 365/205; 365/207; 365/194

(58) Field of Classification Search .................. 365/205, 365/207, 194

See application file for complete search history.

(56) References Cited

U.S. PATENT DOCUMENTS

| | | | |
|---|---|---|---|
| 6,345,007 B1 * | 2/2002 | Kim .................. | 365/189.16 |
| 6,347,058 B1 | 2/2002 | Houghton et al. | |
| 6,795,372 B2 * | 9/2004 | Kim et al. .................. | 365/230.06 |
| 6,853,593 B1 * | 2/2005 | Bae .................. | 365/189.09 |
| 7,020,043 B1 | 3/2006 | Lee | |
| 7,038,957 B2 | 5/2006 | Kwack et al. | |
| 7,158,430 B2 * | 1/2007 | Byun .................. | 365/205 |
| 2006/0267630 A1 | 11/2006 | Matsui | |
| 2006/0268630 A1 | 11/2006 | Park et al. | |

FOREIGN PATENT DOCUMENTS

| | | |
|---|---|---|
| JP | 10-302467 | 11/1998 |
| JP | 11-273346 | 10/1999 |
| JP | 2006-286163 | 10/2006 |
| JP | 2006-309916 | 11/2006 |
| KR | 1998-086263 | 12/1998 |
| KR | 1999-0066047 | 8/1999 |
| KR | 2002-0057280 | 7/2002 |

* cited by examiner

*Primary Examiner*—Ahn Phung
(74) *Attorney, Agent, or Firm*—Blakely, Sokoloff, Tylor & Zafman LLP

(57) ABSTRACT

A semiconductor memory device having a bit line sense amplifier supporting an over driving operation includes a voltage divider; a plurality of signal converters; a delay unit; and a drive control signal generator. The voltage divider divides an external voltage to generate a plurality of different voltage levels. The signal converters convert each of the plurality of voltage levels into a corresponding digital signal. The delay unit delays an active signal provided from outside by a delay amount for defining an over driving interval in response to the plurality of digital signals. The drive control signal generator generates a drive control signal for a bit line sense amplifier driver in response to a delayed active signal from the delay unit.

8 Claims, 6 Drawing Sheets

SEMICONDUCTOR MEMORY DEVICE

CROSS-REFERENCE TO RELATED APPLICATION

The present invention claims priority of Korean patent application number 10-2006-0095187, filed on Sep. 28, 2006, which is incorporated by reference in its entirety.

BACKGROUND OF THE INVENTION

The present invention relates to semiconductor design technologies; and, more particularly, to a control signal generator for a bit line sense amplifier driver for use in the semiconductor memory device.

In recent semiconductor memory devices, a power supply voltage is being increasingly reduced as a line width and a cell size become continuously scaled down. Thus, a need has existed for a design technology to meet the performance required in the low voltage environment.

Meanwhile, most semiconductor memory devices incorporate an internal voltage generation circuit for taking an external voltage (power supply voltage) and generating an internal voltage within a chip to supply voltages needed in circuits inside the chip. Among them, in memory devices using a bit line sense amplifier (BLSA) such as DRAM, a core voltage VCORE has been used for sensing cell data.

But, when only the core voltage VCORE is utilized in the DRAM which is under a trend that an operating voltage is being lowered, it is difficult to amplify a large amount of cell data for a short time.

To solve the above problem, a BLSA over driving method has been employed, in which a pull-up power line of the BLSA is driven by a voltage (generally, power supply voltage VDD) higher than the core voltage VCORE for a certain time during an initial operation (immediately after charge sharing between a memory cell and a bit line) of the BLSA.

FIG. 1 is a circuit diagram illustrating a conventional BLSA driver.

Referring to FIG. 1, the BLSA driver is provided with a normal driver N2 for driving a pull-up power line RTO of the BLSA with a normal driving voltage VCORE, an over driver N1 for driving the pull-up power line RTO of the BLSA with an over driving voltage VDD, and a pull-down driver N3 for driving a pull-down power line SB of the BLSA with a pull-down driving voltage VSS. In addition, the BLSA driver is further provided with a power line precharge part 11 for precharging the power lines RTO and SB of the BLSA.

Briefly explaining an operation, when data stored in a memory cell is carried on bit lines BL/BLB, there occurs a potential difference (A interval).

The BLSA is operated to amplify the potential difference. That is, the BLSA driver first drives the pull-up power line RTO of the BLSA with the over driving voltage VDD (B interval) to thus improve the sensing capability of the BLSA. At this time, the over driver N1 is driven by taking an over driving signal SAP1 via its gate. This over driving interval B is a fixed interval which is set by considering the sensing time and sensing efficiency.

Next, the over driving signal SAP1 is inactivated and the normal driving signal SAP2 is activated, so that the pull-up power line RTO of the BLSA is driven by the normal driving voltage VCORE (C interval).

When the pull-up power line RTO of the BLSA is driven by the over driving voltage VDD or the normal driving voltage VCORE, the pull-down power line SB should also be driven by the pull-down driving voltage VSS.

By the operation of the BLSA driver, the BLSA is operated, wherein a variation of the voltage level of the bit lines BL/BLB by the operation of the BLSA will be shown below.

FIG. 2 is a diagram describing a variation of a voltage level on bit lines according to the operation of the BLSA.

Referring to FIG. 2, the bit lines BL/BLB are driven by a precharge voltage VCORE/2 by a precharge operation of a semiconductor memory device (D interval).

Thereafter, the data is outputted from the memory cell, and a potential difference exists between the bit lines BL/BLB (A interval) and is further amplified by the over driving operation of the BLSA (B interval). Subsequently, the data is maintained by a normal driving operation (C operation) after securing the sensing capability as desired.

After the data is carried on a data transfer line, the bit lines BL/BLB are driven by the precharge voltage VCORE/2.

Here, the over driving operation refers to an operation in which the pull-up power line of the BLSA is driven by the over driving voltage VDD, as set forth above.

Further, the over driving voltage VDD is a voltage applied from outside, and its level is varied as the environment.

Under the above circumstance, although the over driving operation (B interval) is ended and converted into the normal driving operation (C interval), the voltage level of the bit lines (BL/BLB) does not become the core voltage VCORE but has a voltage level which is greater than the core voltage VCORE.

FIG. 3 is a diagram describing the bit lines (BL/BLB) with a voltage level increased by an excessive over driving operation.

Referring to FIG. 3, the bit lines BL/BLB are driven by an excessive over driving voltage VDD+β during the over driving operation and maintain a higher voltage level than the core voltage VCORE, even during the normal driving operation.

Further, after the sensing operation has been completed, the bit lines BL/BLB are also driven by a higher voltage level VCORE/2+Δ than the precharge voltage VCORE/2.

This acts as a factor that obstructs not only the operation of the semiconductor memory device but also the security of the semiconductor memory device with a low power.

Thus, in order to drop the increased voltage level by the excessive over driving operation as above, the semiconductor memory device is further provided with a core voltage discharge device. However, this discharge operation causes an unnecessary current consumption.

On the contrary, in case where the level of the over driving voltage VDD is low, there may occur a problem in which the over driving operation is ended before the bit lines BL/BLB reach the core voltage VCORE by the fixed over driving interval (see FIG. 4). This becomes a reason that reduces the sensing capability of the BLSA.

SUMMARY OF THE INVENTION

Embodiments of the present invention are directed to provide a semiconductor memory device having an adjustable over driving time in response to a level of an over driving voltage.

In accordance with an aspect of the present invention, there is provided a semiconductor memory device having a bit line sense amplifier supporting an over driving operation including a voltage divider; a plurality of signal converters; a delay unit; and a drive control signal generator. The voltage divider divides an external voltage to generate a plurality of different voltage levels. The signal converters convert each of the plurality of voltage levels into a corresponding digital signal. The delay unit delays an active signal provided from outside by a delay amount for defining an over driving interval in response to the plurality of digital signals. The drive control signal generator generates a drive control signal for a bit line sense amplifier driver in response to a delayed active signal from the delay unit.

DESCRIPTION OF SPECIFIC EMBODIMENTS

Hereinafter, a preferred embodiment of the present invention will be set forth in detail with reference to the accompanying drawings so that a person skilled in the art can easily carry out the invention.

The present invention is characterized by adjusting an over driving operation time of a BLSA in conformation with a swing over driving voltage VDD level.

For this, the present invention provides a device as follows.

Figure 1:
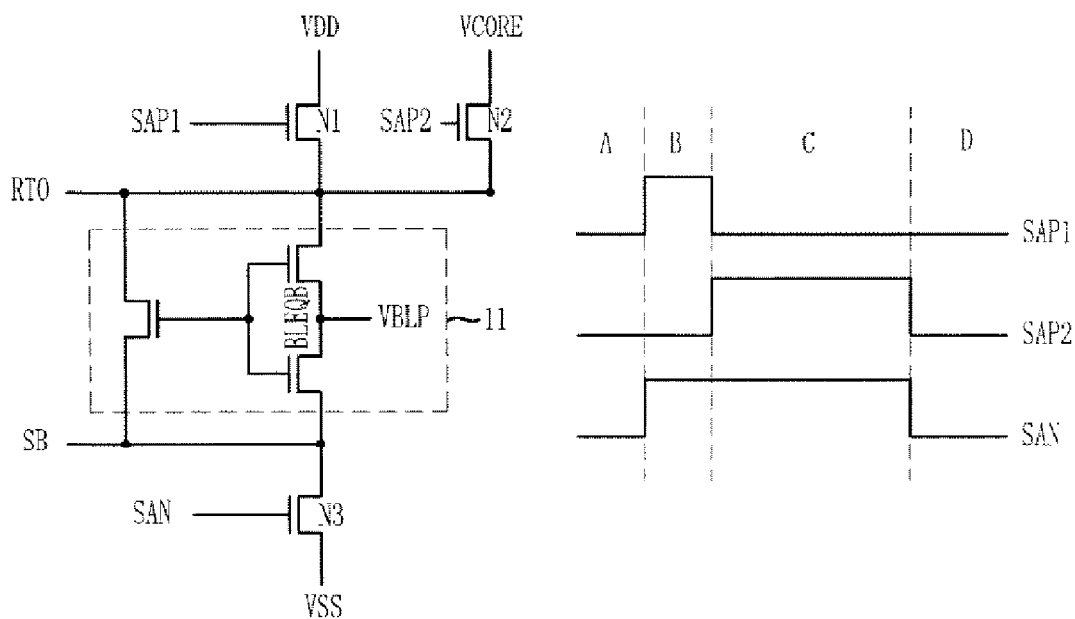
FIG. 1 is a circuit diagram illustrating a conventional BLSA driver.
Figure 2:
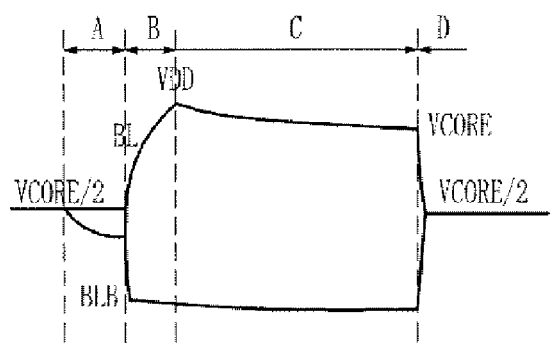
FIG. 2 is a diagram describing a variation of a bit line voltage level according to the operation of the BLSA.
Figure 3:
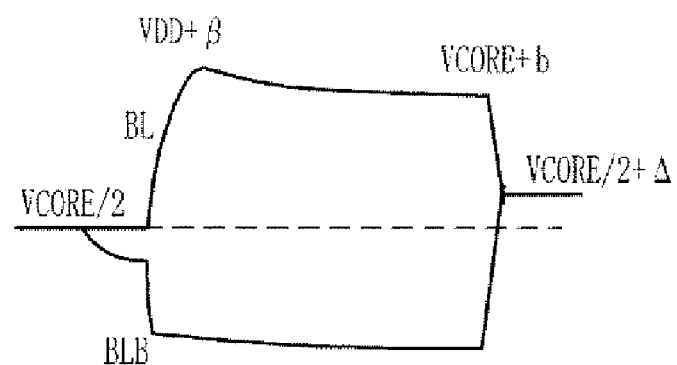
FIG. 3 is a diagram describing the bit lines (BL/BLB) with a voltage level increased by an excessive over driving operation.
Figure 4:
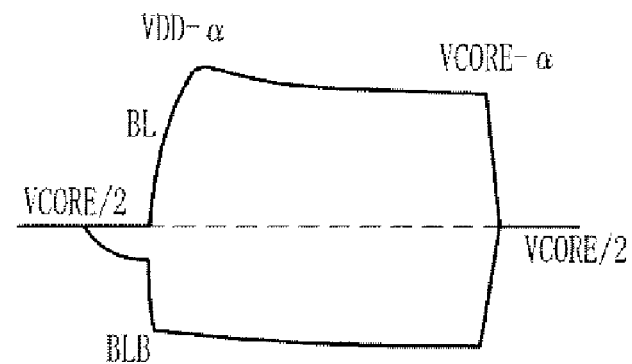
FIG. 4 is a diagram describing that the sensing efficiency is decreased by a narrow over driving interval.
Figure 5:
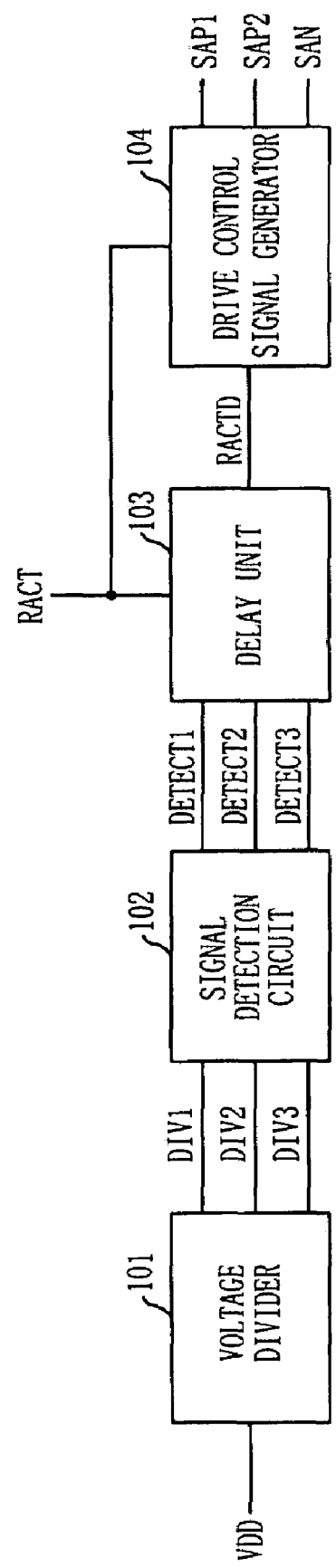
FIG. 5 illustrates a block diagram of a BLSA driver control signal generator in accordance with a preferred embodiment of the present invention.

FIG. 5 illustrates a block diagram of a BLSA driver control signal generator in accordance with a preferred embodiment of the present invention.

Referring to FIG. 5, the BLSA driver control signal generator includes a voltage divider 101 for dividing an external voltage to generate a plurality of different voltage levels DIV1 to DIV3, a signal conversion circuit 102 having a plurality of signal converters for converting the plurality of voltage levels DIV1 to DIV3 into corresponding digital signals DETECT1 to DETECT3, respectively, a delay unit 104 for delaying an active signal RACT provided from outside by a delay amount for defining an over driving interval in response to the plurality of digital signals DETECT1 to DETECT3, and a drive control signal generator 104 for generating drive control signals for a BLSA driver in response to the delayed active signal RACTD from the delay unit 103.

Each of the above components will be described in detail below.

Figure 6:
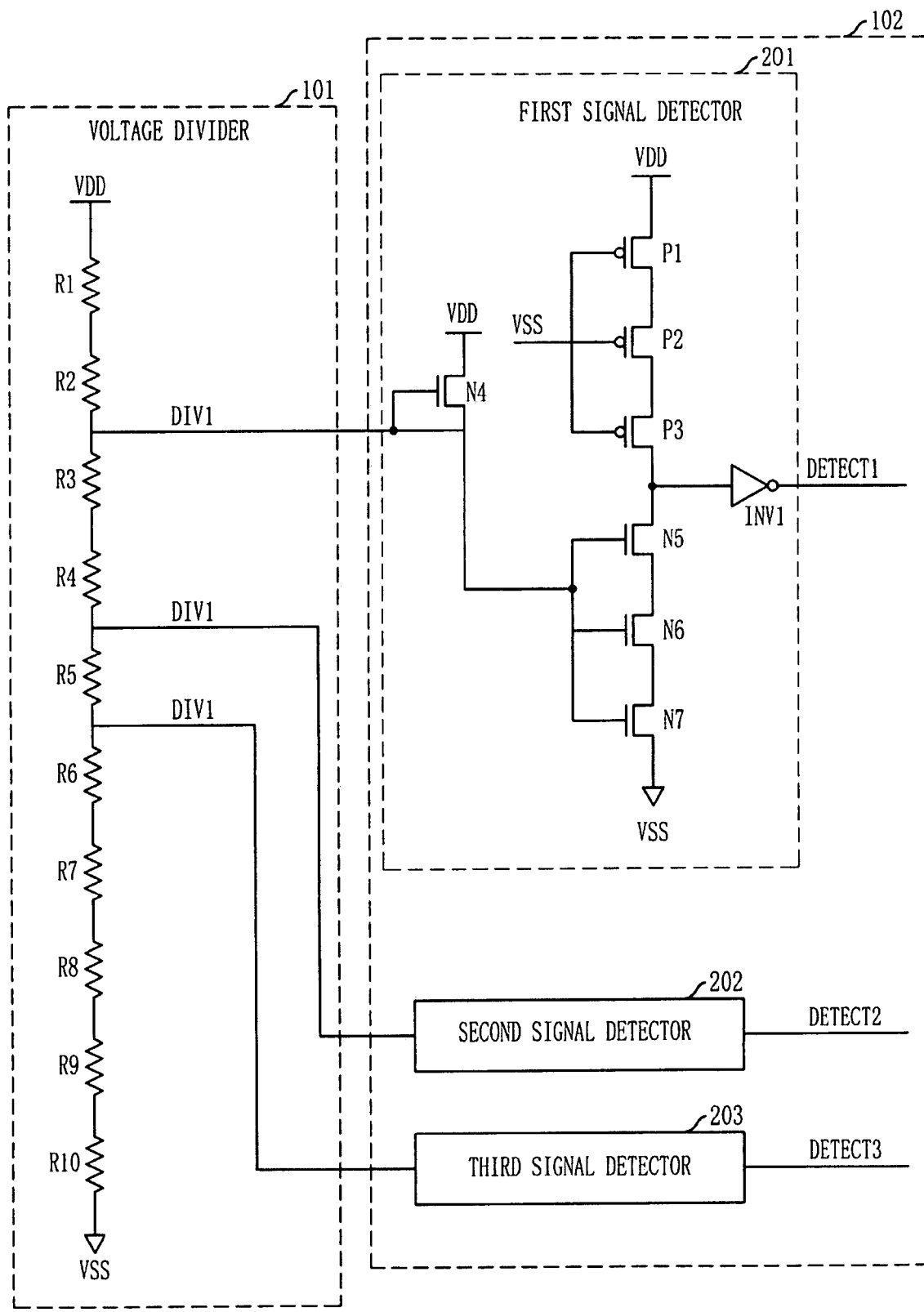
FIG. 6 is detailed circuit diagrams of the voltage divider and the signal conversion circuit shown in FIG. 5.

FIG. 6 is detailed circuit diagrams of the voltage divider 101 and the signal conversion circuit 102 shown in FIG. 5.

Referring to FIG. 6, the voltage divider 101 can be implemented by a multiplicity of resistors R1 to R10 connected in series and with a same resistance value.

In this configuration, each of nodes between the ten resistors has a value of [VDD−[(VDD/N×M)] in order. Here, VDD indicates a level of a power supply voltage, N denotes a total number of resistors, and M denotes the node number in the sequence of nodes. In the embodiment of the present invention, the voltage divider 201 generates three output signals DIV1 to DIV3 with different voltage levels.

The output signals DIV1 to DIV3 of the voltage divider 101 are used as input signals of the plurality of signal converters included in the signal conversion circuit 102.

First, the first signal converter 201 can be embodied by a first NMOS transistor N4 whose gate receives a first voltage level DIV1 and drain is connected to a power supply voltage VDD, second to fourth NMOS transistors N5 to N7 whose each gate receives an output signal of the first NMOS transistor N4 and which are connected in series, first to third PMOS transistors P1 to P3 whose each gate receives a ground voltage VSS and which are coupled in series, and an inverter INV1 for inverting an output signal of the second NMOS transistor N5 and an output signal of the third PMOS transistor P3 and providing an inverted signal as a first digital signal DETECT1.

The second signal converter 203 and the third signal converter 204 have the same structure but they have a different gate size of each NMOS transistor, e.g., the first NMOS transistor N4 of the first signal converter 201, of which each gate takes each of the input signals DIV1 to DIV3. Or, the gate size of the NMOS transistor (e.g., each of the second to fourth transistors N5 to N7 of the first signal converter 201) which takes via a gate an output signal of each NMOS transistor taking each of the input signals DIV1 to DIV3 via a gate may be different.

The reason of manufacturing the gate sizes differently from each other is to selectively adjust the logic levels of the digital signals DETECT1 to DETECT3 according to the input signals DIV1 to DIV3 with different voltage levels.

For example, if the level of each of the input signals DIV1 to DIV3 is higher than a corresponding voltage level to be converted by the signal converters 201 to 203 wherein the voltage level to be detected can be selected by the size adjustment of the gate, the first to fourth NMOS transistors N4 to N7 are turned on, so that the first digital signal DETECT1 becomes a logic high level.

On the contrary, if the level of each of the input signals DIV1 to DIV3 is lower than the corresponding voltage level to be converted, the first to fourth NMOS transistors N4 to N7 are not turned on, so that the first digital signal DETECT1 become a logic low level.

In other words, the analog level is converted into the digital level. Thus, each of the digital signals DETECT1 to DETECT3 has a logic high or low level depending on the level of the power supply voltage VDD.

The digital signals DETECT1 to DETECT3 so created are then delivered to the delay unit 103.

Figure 7:
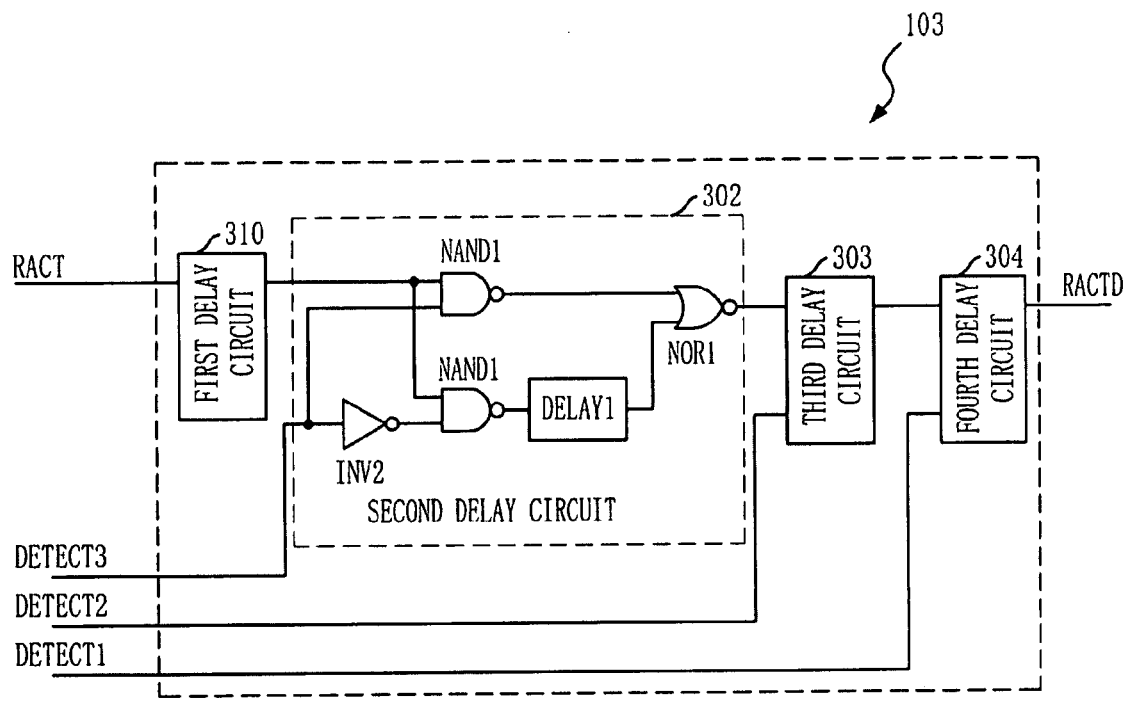
FIG. 7 is a detailed circuit diagram of the delay unit shown in FIG. 5.

FIG. 7 is a detailed circuit diagram of the delay unit 103 shown in FIG. 5.

Referring to FIG. 7, the delay unit 103 is provided with a first delay circuit 301 for delaying an active signal RACT, a second delay circuit 302 for delaying an output signal of the first delay circuit 301 in response to the third digital signal DETECT3, a third delay circuit 303 for delaying an output signal of the second delay circuit 302 in response to the second digital signal DETECT2, and a fourth delay circuit 304 for delaying an output signal of the third delay circuit 303 in response to the first digital signal DETECT1.

Here, the second delay circuit 302 can be implemented by an inverter INV2 for inverting the third digital signal DETECT3, a second NAND gate NAND2 taking an output signal of the first delay circuit 301 and an output signal of the inverter INV2, a first NAND gate NAND1 taking an output signal of the first delay circuit 301 and the third digital signal DETECT3, a delay element DELAY1 for delaying an output signal of the second NAND gate NAND2, and a NOR gate NOR1 receiving an output signal of the first NAND gate NAND1 and an output signal of a delay element DELAY1.

Further, the second to fourth delay circuits 302 to 304 have different delay time information but have a same inside circuit configuration. That is, each of the delay circuits 302 to 304 has only different delay time information of each delay element DELAY1 but is implemented by a same circuit.

Also, the present invention may be provided with additional second to fourth delay circuits 302 to 304 in order to have a finer over driving interval, and may also have the digital signals DETECT1 to DETECT3 corresponding thereto.

The first delay circuit 301 is a circuit provided to guarantee a minimum over driving interval, wherein it is preferable to have delay time information that considers a maximum value level of the power supply voltage VDD being varied. All the delay time information of the delay unit 102 should be a value that considers the minimum value level of the power supply voltage VDD being varied.

Figure 8:
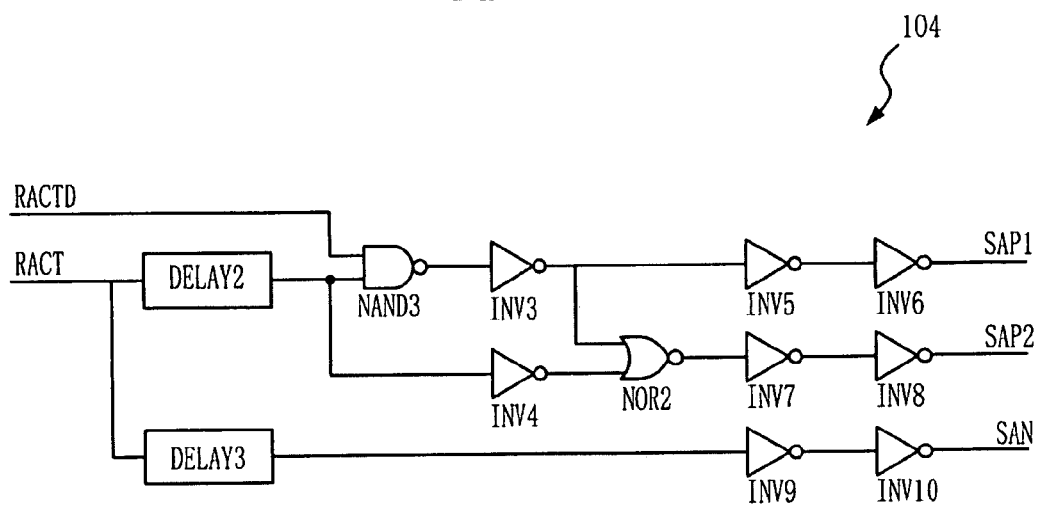
FIG. 8 is a detailed circuit diagram of the signal generator shown in FIG. 5.

FIG. 8 is a detailed circuit diagram of the signal generator 104 shown in FIG. 5.

Referring to FIG. 8, the signal generator 104 receives the active signal RACT and the delayed active signal RACTD and generates an over driving signal SAP1, a normal driving signal SAP2 and a pull-down driving signal SAN.

For this, the signal generator 104 can be embodied by first and second delay elements DELAY2 and DELAY3 for delaying the active signal RACT, a NAND gate NAND3 taking an output signal of the first delay element DELAY2 and the delayed active signal RACTD, first, second and third inverters INV3, INV5 and INV6 for inverting and buffering an output signal of the NAND gate NAND3 to output the over driving signal SAP1, a fourth inverter INV4 for inverting an output signal of the first delay element DELAY2, a NOR gate NOR2 taking an output signal of the first inverter INV3 and an output signal of the fourth inverter INV4, a fifth inverter INV7 and a sixth inverter INV8 for buffering an output signal of the NOR gate NOR2 to output the normal driving signal SAP2, and a seventh inverter INV9 and an eighth inverter INV10 for buffering an output signal of the second delay element DELAY3 to provide the pull-down driving signal SAN.

In operation of the BLSA driver control signal generator of the invention as described above, the voltage divider 101 divides the power supply voltage VDD provided from the outside to generate the three voltage levels DIV1 to DIV3. At this time, the number of the divided signals is preferably set to have a more efficient over driving interval.

Thereafter, the signal converter 102 converts the voltage levels DIV1 to DIV3 into the digital signals DETECT1 to DETECT3, respectively. The digital signals DETECT1 to DETECT3 thus generated are used as the control signals of the delay unit 102.

In case where the level of the power supply voltage VDD is higher or lower than a reference level, it is judged whether or not the delay circuits 302 to 304 of the delay unit 103 will be used based on the digital signals DETECT1 to DETECT3, to decide an activation width of the over driving signal SAP1.

For example, when the level of the power supply voltage VDD is supplied to be higher than the reference level, the signal conversion circuit 102 outputs the three digital signals DETECT1 to DETECT3 with a logic high level.

In response to these signals, the second to fourth delay circuits 302 to 304 of the delay unit 102 are not operated.

Thus, the signal generator 104 generates the over driving signal SAP1 with only delay time information of the first delay circuit 301.

In result, when the level of the power supply voltage VDD becomes higher than the reference level, the over driving signal SAP1 with a narrow activation width is created to thereby decide the over driving interval.

On the contrary, when the level of the power supply voltage VDD is supplied to be lower than the reference level, only the first digital signal DETECT1 becomes a logic high level and the remaining digital signals DETECT2 and DETECT3 become a logic low level.

In response to this, the second and the third delay circuits 302 and 303 of the delay unit 103 are operated and only the fourth delay circuit 304 is not operated. Thus, the signal generator 104 generates the over driving signal SAP1 with delay time information of the first delay circuit 301 and delay time information of the second and the third delay circuits 302 and 303.

In result, when the level of the power supply voltage VDD becomes lower than the reference level, the over driving signal SAP1 with a wide activation width is created to thereby decide the over driving interval.

Figure 9A:
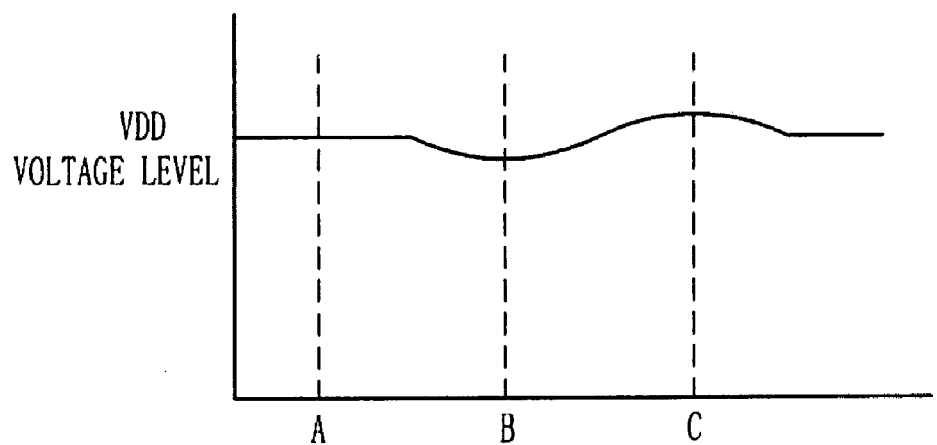
FIG. 9A is a graph representing a power supply voltage level.
Figure 9B:
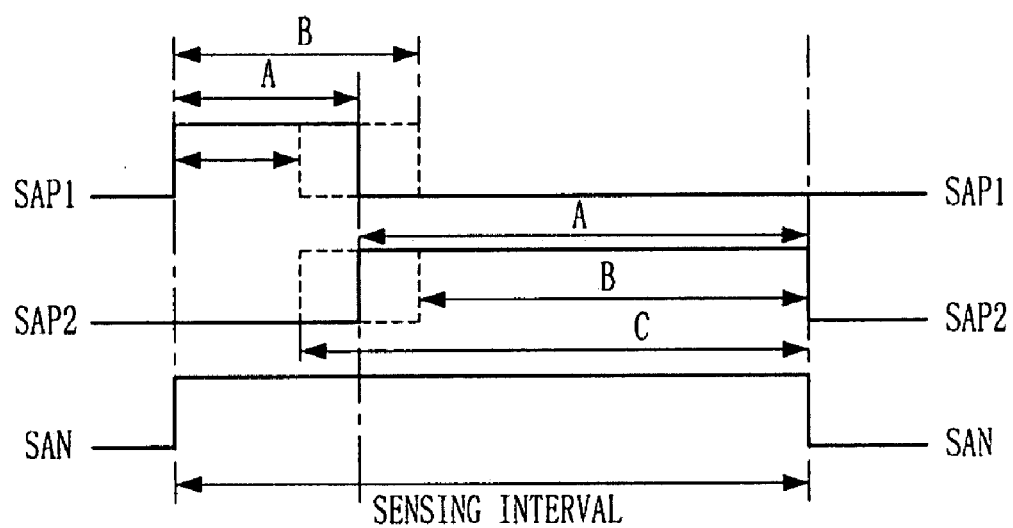
FIG. 9B is a waveform illustrating a sensing interval in accordance with an embodiment of the present invention.

FIG. 9A is a graph representing a power supply voltage level; and FIG. 9B is a waveform illustrating a sensing interval in accordance with an embodiment of the present invention.

Referring to FIG. 9 supporting the above description, in case where the level of the power supply voltage VDD is lower (B) or higher (C) than the reference voltage level as shown in a graph of FIG. 9A, it can be seen that the over driving interval can be varied as a level variation of the power supply voltage VDD as depicted in a timing diagram of FIG. 9B, wherein A, B, C of FIG. 9A correspond to A, B, C of FIG. 9B, respectively.

Here, in the state where the total sensing interval is set, the normal driving interval is also varied whenever the over driving interval is varied.

In short, when the over driving voltage VDD is varied, the present invention adjusts the over driving interval width correspondingly thereto and maintains the sensing operation efficiency, in the BLSA that increases the sensing operation efficiency by using the over driving voltage VDD (power supply voltage).

In other words, when the level of the over driving voltage VDD is lower than the reference voltage, the present invention increases the over driving interval width, while when the level of the over driving voltage VDD is higher than the reference voltage, the present invention decreases the over driving interval width.

It should be noted that the logic gates and transistors illustrated in the preferred embodiment as discussed above may be implemented in different types and arrangements based on the polarities of the input and output signals used therein.

As described above, the present invention provides a semiconductor memory device which can adjust an over driving interval width correspondingly to an over driving voltage VDD being varied.

Accordingly, the present invention can always acquire a maximum sensing efficiency based on the adjusted over driving interval width.

Moreover, the present invention discharges a bit line voltage increased by an excessive over driving operation to solve an unnecessary current consumption problem, thereby reducing the amount of current consumption.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device having a bit line sense amplifier supporting an over driving operation, comprising:
   a voltage divider for dividing an external voltage to generate a plurality of different voltage levels;
   a plurality of signal converters for converting each of the plurality of voltage levels into a corresponding digital signal;
   a delay unit for delaying an active signal by a delay amount for defining an over driving interval in response to the plurality of digital signals; and
   a drive control signal generator for generating a drive control signal for a bit line sense amplifier driver in response to the delayed active signal from the delay unit.

2. The semiconductor memory device as recited in claim 1, wherein the voltage divider comprises a plurality of resistors.

3. The semiconductor memory device as recited in claim 1, wherein each of the plurality of signal converters comprises a plurality of transistors with different gate sizes.

4. The semiconductor memory device as recited in claim 3, wherein each of the plurality of signal converters includes:
   a first NMOS transistor whose gate receives an output signal of the voltage divider and drain is connected to a power supply voltage VDD;
   second to fourth NMOS transistors whose gates receive an output signal of the first NMOS transistor and which are connected in series;
   first to third PMOS transistors whose gates receive a ground voltage VSS and which are connected in series; and
   a first inverter for inverting output signals of the second NMOS transistor and the third PMOS transistor and providing an inverted signal as a digital signal.

5. The semiconductor memory device as recited in claim 1, wherein the delay unit includes a plurality of delay circuits with different delay amounts.

6. The semiconductor memory device as recited in claim 5, wherein the delay unit further includes a first delay circuit for securing a minimum over driving interval.

7. The semiconductor memory device as recited in claim 6, wherein the first delay circuit includes:
   a second inverter for inverting the digital signal;
   a first NAND gate taking an active signal and an output signal of the second inverter;
   a second NAND gate taking the active signal and the digital signal;
   a first delay element for delaying an output signal of the first NAND gate; and
   a first NOR gate receiving output signals of the second NAND gate and the first delay element.

8. The semiconductor memory device as recited in claim 7, wherein the drive control signal generator includes:
   a second and a third delay element for delaying the active signal;
   a third NAND gate taking an output signal of the second delay element and an output signal of the delay unit;
   third to fifth inverters for inverting and buffering an output signal of the third NAND gate to output an over driving signal;
   a sixth inverter for inverting an output signal of the second delay element;
   a second NOR gate receiving an output signal of the third inverter and an output signal of the sixth inverter;
   a seventh and an eighth inverter for buffering an output signal of the second NOR gate to provide a normal driving signal; and
   a tenth inverter for buffering an output signal of the second delay element to generate a pull-down driving signal.

* * * * *